(12) United States Patent
Fantini et al.

(10) Patent No.: US 10,680,037 B2
(45) Date of Patent: Jun. 9, 2020

(54) CROSS-POINT MEMORY AND METHODS FOR FABRICATION OF SAME

(71) Applicant: Micron Technology, Inc., Boise, ID (US)

(72) Inventors: Paolo Fantini, Vimercate (IT); Cristina Casellato, Sulbiate (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/688,027

(22) Filed: Aug. 28, 2017

(65) Prior Publication Data

US 2017/0358628 A1 Dec. 14, 2017

Related U.S. Application Data

(63) Continuation of application No. 14/535,731, filed on Nov. 7, 2014, now Pat. No. 9,748,311.

(51) Int. Cl.
*H01L 21/764* (2006.01)
*H01L 21/762* (2006.01)
(Continued)

(52) U.S. Cl.
CPC ........ *H01L 27/2463* (2013.01); *H01L 21/764* (2013.01); *H01L 21/7682* (2013.01); *H01L 21/76224* (2013.01); *H01L 21/76837* (2013.01); *H01L 27/115* (2013.01); *H01L 27/1157* (2013.01); *H01L 27/11521* (2013.01);
(Continued)

(58) Field of Classification Search
CPC ....... H01L 45/1233–124; H01L 27/2463–249; H01L 27/11524; H01L 27/2481; H01L 27/11521; H01L 27/11568–1157; H01L 21/764; H01L 45/06; H01L 45/1675; H01L 27/2409; H01L 27/115; H01L 21/7682; H01L 21/76224; H01L 21/76837
See application file for complete search history.

(56) References Cited

U.S. PATENT DOCUMENTS 6,404,003 B1 6/2002 McMillan et al.
6,875,651 B2 4/2005 Hsu et al.
(Continued)

FOREIGN PATENT DOCUMENTS

CN 103682094 A 3/2014
JP 2011146590 A 7/2011
(Continued)

OTHER PUBLICATIONS

Dameron et al., "Molecular Layer Deposition of Alucone Polymer Films Using Trimethylaluminum and Ethylene Glycol," Chem. Matter., vol. 20. No. 10, 2008, pp. 3315-3326.
(Continued)

*Primary Examiner* — Zandra V Smith
*Assistant Examiner* — Jeremy J Joy
(74) *Attorney, Agent, or Firm* — Holland & Hart LLP

(57) ABSTRACT

A cross-point memory array includes a plurality of variable resistance memory cell pillars. Adjacent memory cell pillars are separated by a partially filled gap that includes a buried void. In addition, adjacent memory cell pillars include storage material elements that are at least partially interposed by the buried void.

12 Claims, 9 Drawing Sheets

(51) Int. Cl.
- *H01L 21/768* (2006.01)
- *H01L 27/115* (2017.01)
- *H01L 27/11521* (2017.01)
- *H01L 27/11524* (2017.01)
- *H01L 27/1157* (2017.01)
- *H01L 27/24* (2006.01)
- *H01L 45/00* (2006.01)

(52) U.S. Cl.
CPC .... *H01L 27/11524* (2013.01); *H01L 27/2427* (2013.01); *H01L 45/06* (2013.01); *H01L 45/1233* (2013.01); *H01L 45/1293* (2013.01); *H01L 45/141* (2013.01); *H01L 45/144* (2013.01); *H01L 45/1675* (2013.01)

(56) References Cited

U.S. PATENT DOCUMENTS

| | | | |
|---|---|---|---|
| 7,045,849 B2 | 5/2006 | Chen et al. | |
| 7,629,213 B2 | 12/2009 | Cho et al. | |
| 7,705,392 B2 | 4/2010 | Yonemochi et al. | |
| 7,852,658 B2 | 12/2010 | Liu et al. | |
| 7,915,602 B2 | 3/2011 | Sato | |
| 7,977,662 B2 | 7/2011 | Ryoo et al. | |
| 8,129,705 B2 | 3/2012 | Kinoshita et al. | |
| 8,143,610 B2 | 3/2012 | Park et al. | |
| 8,153,527 B2 | 4/2012 | Loh et al. | |
| 8,203,134 B2 | 6/2012 | Liu | |
| 8,344,513 B2 | 1/2013 | Yu et al. | |
| 8,546,239 B2 | 10/2013 | Harari et al. | |
| 8,569,731 B2 | 10/2013 | Konno et al. | |
| 8,575,019 B2 | 11/2013 | Zhao | |
| 8,613,863 B2 | 12/2013 | Tong et al. | |
| 8,623,697 B2 | 1/2014 | Magistretti et al. | |
| 8,623,736 B2 | 1/2014 | Liu | |
| 8,629,035 B2 | 1/2014 | Nakazawa | |
| 8,723,152 B2 | 5/2014 | Nishi et al. | |
| 8,765,581 B2 | 7/2014 | Lee et al. | |
| 8,913,417 B2 | 12/2014 | Schricker et al. | |
| 8,937,292 B2 | 1/2015 | Bateman | |
| 9,136,307 B2 | 9/2015 | Pellizzer | |
| 9,252,188 B2 | 2/2016 | Tang et al. | |
| 9,318,430 B2 | 4/2016 | Tang et al. | |
| 9,577,010 B2 | 2/2017 | Sciarrillo | |
| 2006/0231884 A1* | 10/2006 | Yonemochi | H01L 21/7682 257/314 |
| 2007/0063256 A1* | 3/2007 | Imai | H01L 21/764 257/315 |
| 2008/0003724 A1* | 1/2008 | Cho | H01L 27/115 438/142 |
| 2009/0047777 A1* | 2/2009 | Nagano | H01L 21/76837 438/593 |
| 2009/0127538 A1* | 5/2009 | Ryoo | H01L 27/2409 257/5 |
| 2009/0212352 A1* | 8/2009 | Aoyama | H01L 21/764 257/324 |
| 2009/0302362 A1 | 12/2009 | Kikuchi et al. | |
| 2010/0032637 A1* | 2/2010 | Kinoshita | G11C 11/5678 257/2 |
| 2010/0096611 A1 | 4/2010 | Wang et al. | |
| 2010/0270527 A1* | 10/2010 | Sawamura | H01L 27/2463 257/2 |
| 2011/0037046 A1* | 2/2011 | Sato | H01L 45/124 257/4 |
| 2011/0303967 A1* | 12/2011 | Harari | H01L 21/764 257/321 |
| 2011/0309430 A1* | 12/2011 | Purayath | H01L 21/764 257/321 |
| 2012/0074484 A1* | 3/2012 | Kang | H01L 21/764 257/316 |
| 2012/0104485 A1* | 5/2012 | Yang | H01L 21/764 257/324 |
| 2013/0016557 A1 | 1/2013 | Kim | |
| 2013/0032871 A1* | 2/2013 | Shin | H01L 21/764 257/315 |
| 2013/0102124 A1* | 4/2013 | Nakazawa | H01L 21/764 438/422 |
| 2013/0126816 A1* | 5/2013 | Tang | H01L 27/2463 257/3 |
| 2013/0207068 A1* | 8/2013 | Pellizzer | H01L 45/16 257/5 |
| 2013/0248971 A1* | 9/2013 | Miyazaki | H01L 27/1052 257/319 |
| 2014/0061759 A1* | 3/2014 | Lee | H01L 29/66825 257/321 |
| 2014/0061761 A1* | 3/2014 | Kubota | H01L 29/66825 257/324 |
| 2015/0137061 A1 | 5/2015 | Donghi et al. | |
| 2015/0214478 A1* | 7/2015 | Lee | H01L 45/1233 257/5 |
| 2015/0243708 A1 | 8/2015 | Ravasio et al. | |
| 2015/0263277 A1 | 9/2015 | Ozawa | |
| 2015/0287916 A1 | 10/2015 | Campbell et al. | |
| 2016/0056208 A1 | 2/2016 | Pellizzer et al. | |

FOREIGN PATENT DOCUMENTS

| | | | |
|---|---|---|---|
| JP | 2013069794 A | 4/2013 | |
| KR | 20080060321 A | 7/2008 | |
| WO | 2011086725 A1 | 7/2011 | |
| WO | WO-2011086725 A1 * | 7/2011 | ......... H01L 45/1293 |

OTHER PUBLICATIONS

ISA/EPO, International Search Report and Written Opinion of the International Searching Authority, Int'l Appl. No. PCT/US2015/015023, dated May 7, 2015, Korean Intellectual Property Office, Daejeon Metropolitan City, 13 pgs.

ISA/EPO, International Search Report and Written Opinion of the International Searching Authority, Int'l Appl. No. PCT/US2015/055392, dated Mar. 25, 2016, Korean Intellectual Property Office, Seo-gu, Daejeon, Republic of Korea, 15 pgs.

Jen et al., "Critical tensile strain and water vapor transmission rate for nanolaminate films grown using $Al_2O_3$ atomic layer deposition and alucone molecular layer deposition," Applied Physics Letters, vol. 101, 234103, 2012, 3 pgs.

Seghete et al., "Sacrificial layers for air gaps in NEMS using alucone molecular layer deposition," Sensors and Actuators A: Physical, 2009, 8 pgs.

European Patent Office, "Examination Report," issued in connection with European Patent Application No. 15856617.4, dated Mar. 27, 2019 (4 pages).

* cited by examiner

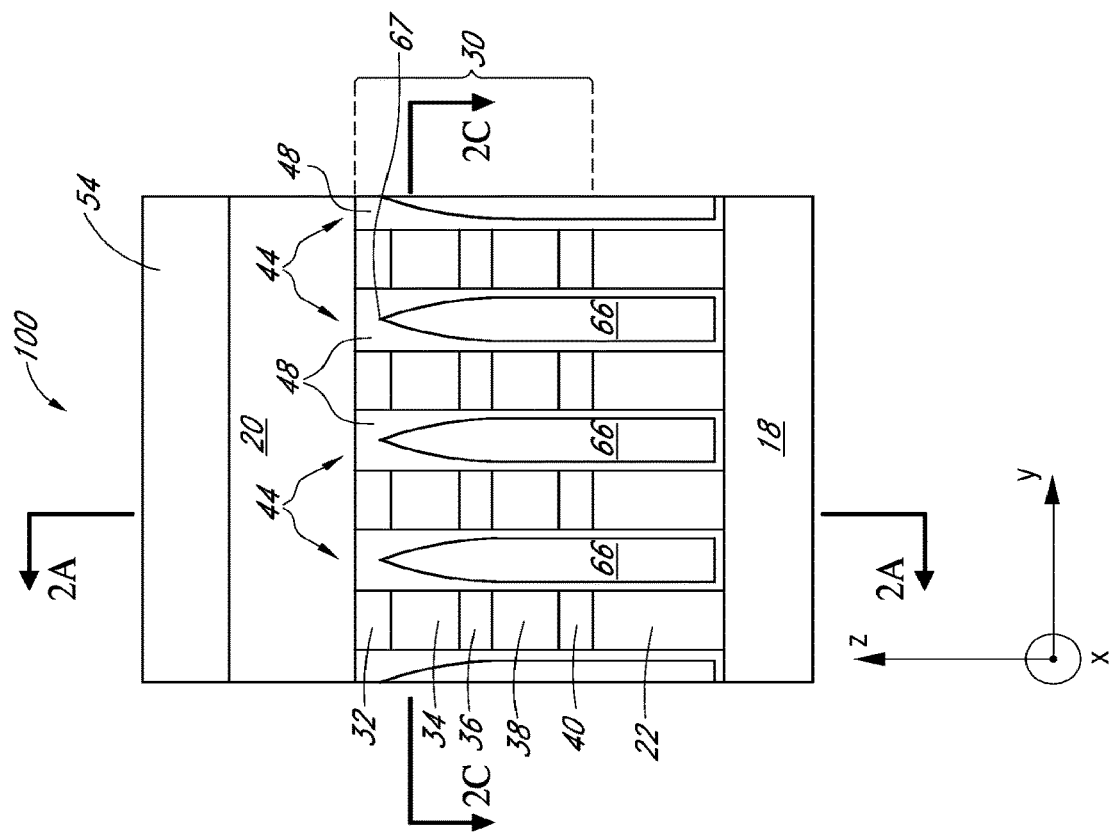
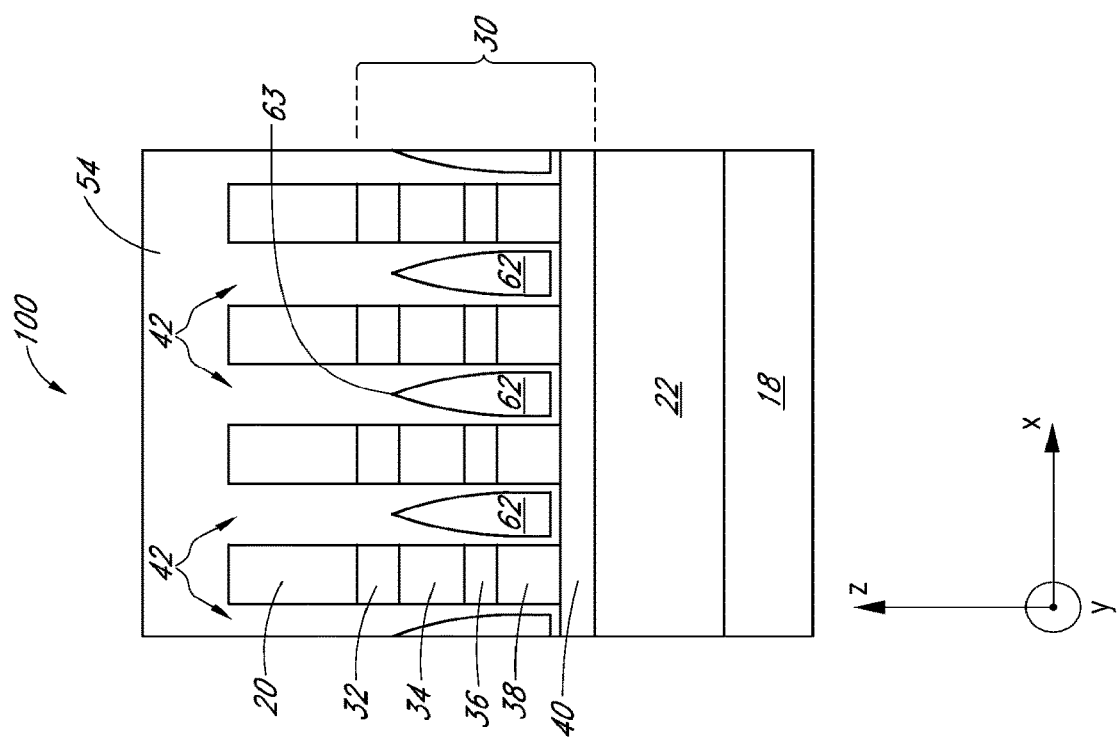

… (1)

CROSS-POINT MEMORY AND METHODS FOR FABRICATION OF SAME

CROSS REFERENCE

The present Application for Patent is a continuation of U.S. patent application Ser. No. 14/535,731 by Fantini et al., entitled "Cross-Point Memory and Methods for Fabrication of Same," filed Nov. 7, 2014, now U.S. Pat. No. 9,748,311 issued Aug. 29, 2017, assigned to the assignee hereof, and is expressly incorporated by reference in its entirety herein.

BACKGROUND

Field

The disclosed technology generally relates to integrated circuit devices, and in particular to cross-point memory arrays and methods for fabricating the same.

Description of the Related Art

Some memory devices include variable resistance memory cells which can be switched between high and low resistance states in direct or indirect response to an electrical signal, such as a voltage or a current pulse. While switching a target variable resistance memory cell, neighboring cells can be disturbed. Such disturbance can become more pronounced as the memory cells are scaled in dimensions, due to increasing proximity between adjacent memory cells. Thus, there is a need to reduce disturbance of neighboring memory cells while switching a target memory cell in memory devices, such as variable resistance memory devices.

BRIEF DESCRIPTION OF THE DRAWINGS

Claimed subject matter is particularly pointed out in the concluding portion of the specification. However, certain objects, features, and/or advantages thereof, may be better understood by reference to the following detailed description if read with the accompanying drawings in which:

FIG. 2A is a schematic vertical cross section of a memory array including phase change materials, taken in a first direction parallel to a lower conductive line, according to an embodiment.

FIG. 2B is a schematic vertical cross section of the memory array of FIG. 2A, taken in a second direction perpendicular to the first direction and parallel to an upper conductive line.

Figure 1B:
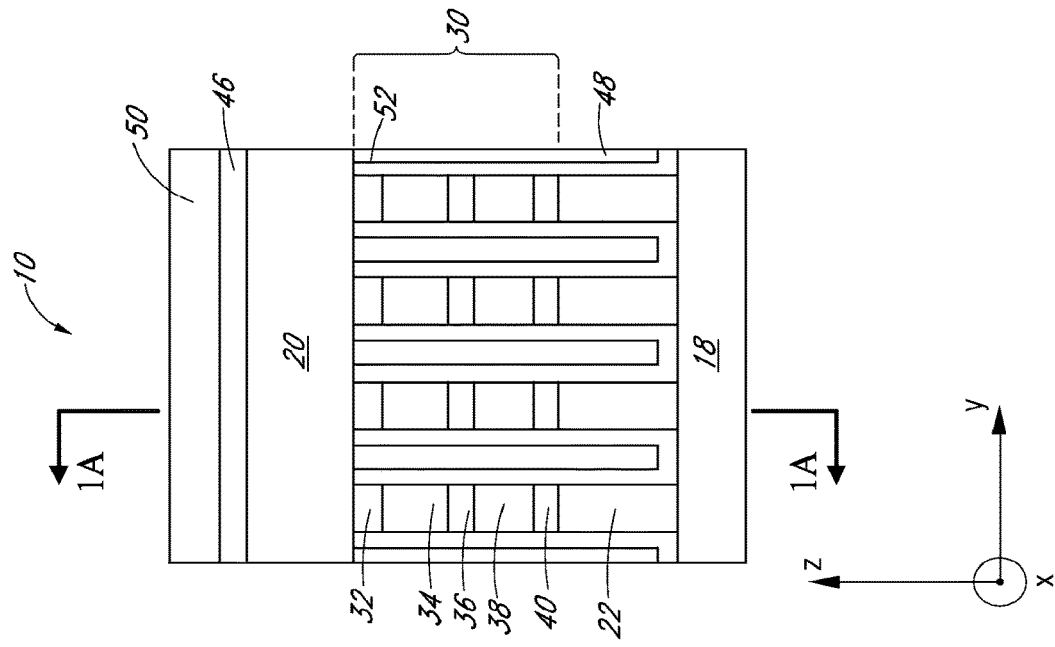
FIG. 1B is a schematic vertical cross section of the memory array of FIG. 1A, taken in a second direction perpendicular to the first direction and parallel to an upper conductive line, according to prior art.

Features in the drawings are not necessarily drawn to scale and may extend in different directions from that illustrated. While various axes and directions are illustrated to facilitate the discussion herein, and to show relative orientations of different parts according to particular embodiments, it will be appreciated that the features may extend in different directions.

DETAILED DESCRIPTION

Some memory devices include memory cells that can be switched between high and low resistance states in direct or indirect response to an electrical signal, such as a voltage or a current pulse. Such memory cells are sometimes called variable resistance memory cells. In some variable resistance change memory cells, the change in electrical resistance during write access operations can be associated at least in part by heat generated by the electrical signal. As used herein, a write access operation can be a program or an erase operation. For a variable resistance memory cell, a program operation can also be referred to as a RESET operation, which can change the resistance state of the memory cell from a relatively low resistance state to a relatively high resistance state. Similarly, an erase operation, which for a variable resistance memory can also be referred to as a SET operation, can change the resistance state of the memory cell from a relatively high resistance state to a relatively low resistance state. It will be understood that the above terminology is arbitrary but conventional for referring to write operations for applying different memory states on variable resistance memory cells.

One category of variable resistance memory cells is phase change memory cell. While the heat generated during switching may be associated with switching of a target phase change memory cell, the heat can sometimes induce adverse effects on neighboring cells, which can be referred to as thermal disturbance. Thermal disturbance, which can in turn lead to unintended changes in resistance and/or unintended switching of neighboring memory cells, generally becomes more pronounced as the memory cells are scaled in dimensions, due to increasing proximity between adjacent memory cells. Thus, there is a need to reduce the adverse effects of the heat during write operations on the neighboring memory cells in variable resistance memory devices.

In some memory technologies, the variable resistance memory cells are arranged in a cross-point array configuration. Generally, a cross-point memory array refers to a memory array having memory elements disposed and electrically connected at intersections between a first set of conductive lines (e.g., word lines) and a second set of conductive lines (e.g., digit lines) overlapping and crossing the first set of conductive lines. The electrical resistance of the variable resistance materials of the cross-point memory array, e.g., phase change materials, can be changed by the electrical signals provided through the first and second conductive lines connected to the variable resistance materials.

Figure 1A:
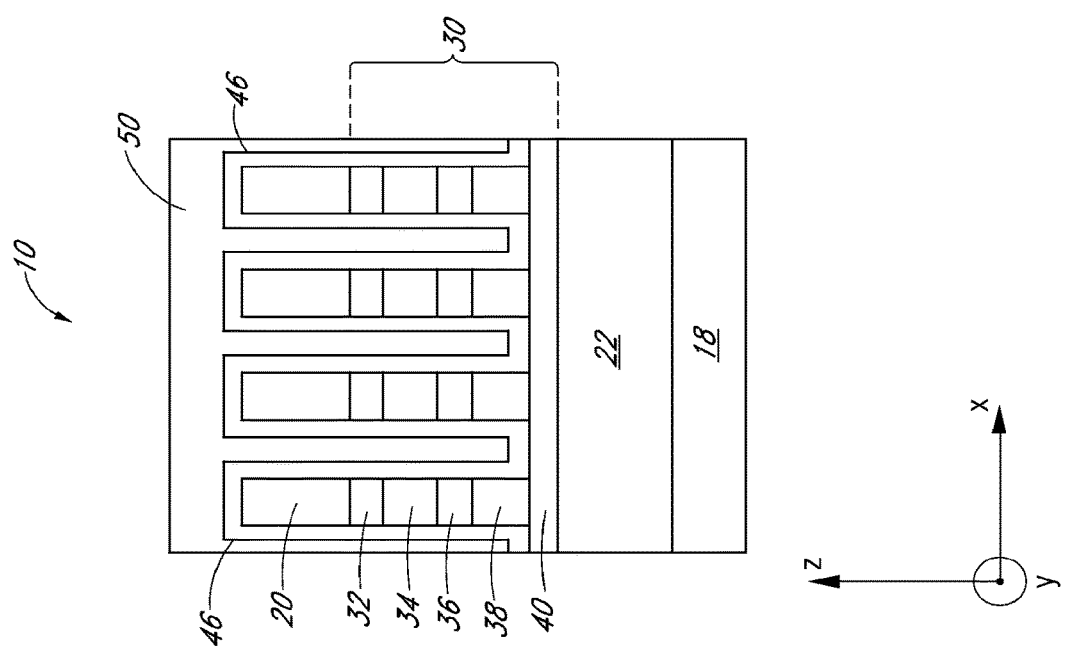
FIG. 1A is a schematic vertical cross section of a memory array including phase change materials, taken in a first direction parallel to a lower conductive line, according to prior art.

FIGS. 1A and 1B illustrate an example of a prior art cross-point memory array 10 having a substrate 18 and a plurality of memory cells 30 formed thereon, viewed in a y-direction, and an x-direction, respectively. Referring to FIGS. 1A and 1B, each of the memory cells 30 is a variable resistance memory cell, e.g., a phase change memory cell, arranged in a stacked configuration between an upper conductive line 20 extending in the y-direction and a lower conductive line 22 extending in the x-direction. The upper and lower conductive lines 20 and 22 are conductors configured to carry electrical signals such as, for example, a voltage or a current pulse, between memory cells 30 and peripheral circuitry such as driver circuitry and sensing circuitry (not shown). Each memory cell 30 includes a first active element 38, e.g., a selector element, and a second active element 34, e.g., a storage element, and in the illustrated embodiment these elements are separated by a middle electrode 36. The illustrated memory cell 30 additionally includes a lower electrode 40 between the first active element 38 and the lower conductive line 22 and an upper electrode 32 between the upper conductive line 20 and the second active element 34.

Referring to FIG. 1A, opposing sidewalls (in the x-direction) of each upper conductive line 20 and each memory cell 30 are lined with a first liner material 46, and spaces between adjacent upper conductive lines 20 and adjacent memory cells 30 are filled with a first isolation material 50. Referring to FIG. 1B, opposing sidewalls (in the y-direction) of each lower conductive line 22 and each memory cell 30 are lined with a second liner material 52, and spaces between adjacent lower conductive lines 22 and spaces between adjacent memory cells 30 are filled with a second isolation material 48.

When the memory cells 30 are phase change memory cells, the temperatures of the first active element 38 and/or the second active element 34 of an accessed memory cell can be raised substantially above room temperature. The heating of the target memory cell, which is accessed for writing, whose peak temperature can reach several hundred degrees, can have detrimental effects on the neighboring cells due to diffusion of heat. For example, increased temperatures of the neighboring memory cells can lead to degradation in data retention and disturbance of the neighboring memory cells.

In the following, various embodiments relating to memory devices and methods of forming the memory devices are disclosed, which can advantageously include buried voids interposed between adjacent memory cells. The inventors have found the various embodiments to substantially reduce transference of heat from one memory cell to surrounding regions of the memory cell, compared to other configurations in which adjacent memory cells are interposed by dielectric regions rather than voids. Without being bound to any theory, the reduction of transference of heat between memory cells interposed by voids can be due to lower thermal conductivity of voids compared to other materials that may interpose adjacent memory cells, such as, for example, silicon oxide or silicon nitride.

The term "void," as used herein, characterizes an enclosed region whose volume is not filled with condensed matter, such as a liquid, a crystalline solid, or an amorphous solid. A void may be formed, for example, when an opening of a gap or a space has been sealed, buried, enclosed or otherwise rendered inaccessible for further filling using, for example, a deposition technique such as chemical deposition or physical vapor deposition. For example, when a material is deposited onto a structure having a gap or a space formed therein, the material may form on upper sidewalls of opposing sidewalls of the gap. When the material formed on opposing sidewalls contact each other to form a seal region prior to filling the volume below the seal region, a buried void may be formed underneath the seal region. Such a void may have trapped therein gaseous species, such as air, or a gas species used during a previous process. Such voids are sometimes referred to in the semiconductor field as "air gaps," although they may instead be filled with an inert gas environment (e.g., $N_2$, $H_2$ or Ar) employed during processing.

Figure 2C:
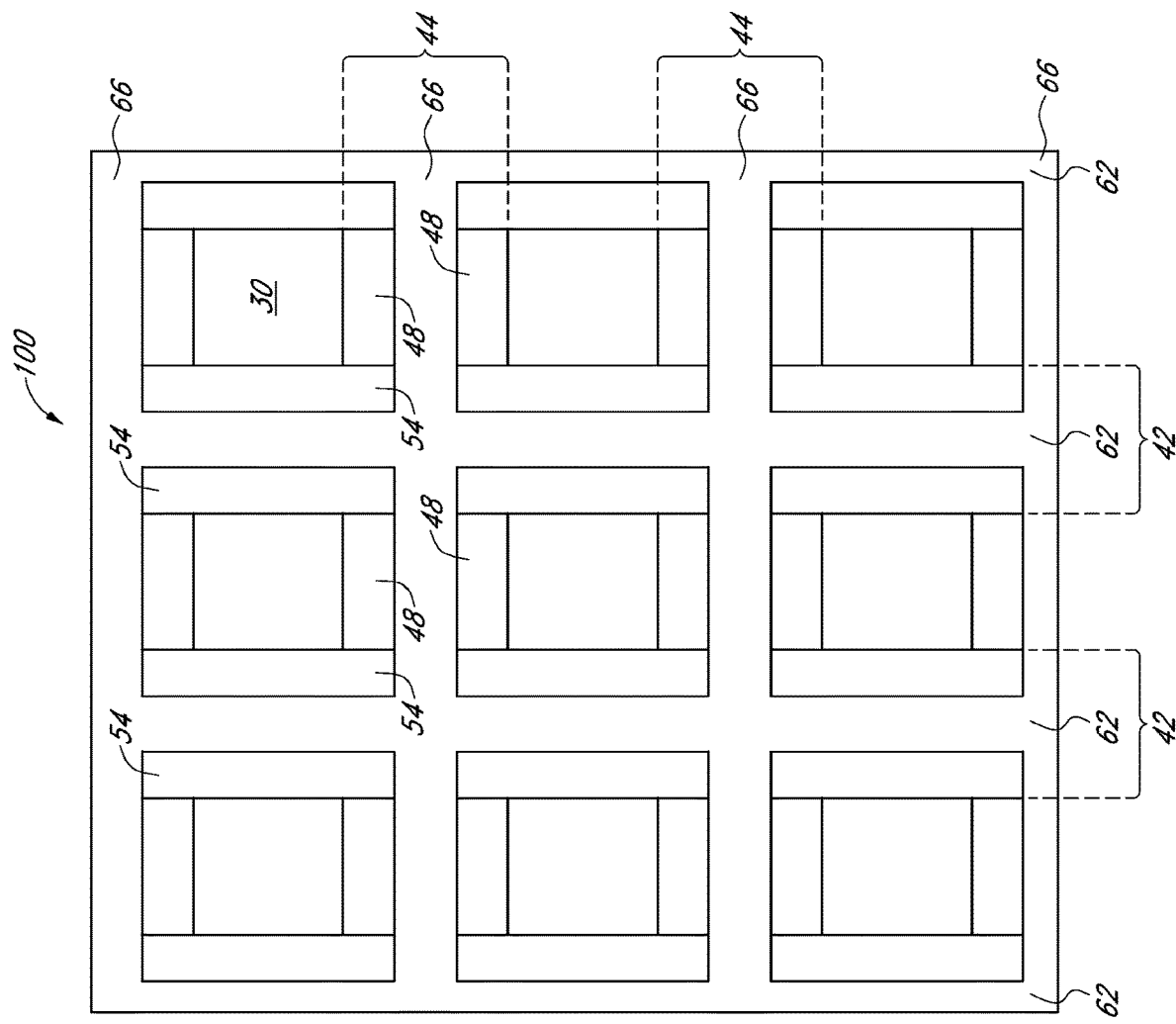
FIG. 2C is a schematic horizontal cross section of the memory array of FIGS. 2A and 2B, taken in a third direction perpendicular to the first and second directions and parallel to the underlying substrate surface.
Figure 2C:
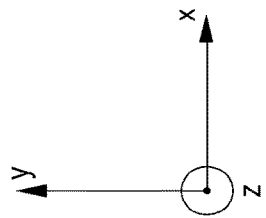

FIGS. 2A, 2B and 2C are cross-sectional depictions of a cross-point memory array 100 having a plurality of memory cells 30, viewed in a y-direction, an x-direction, and a z-direction, respectively, according to some embodiments. Referring to FIGS. 2A and 2B, each of the memory cells 30 is a variable resistance memory cell, e.g., a phase change memory cell, formed as a memory cell pillar having a plurality of memory cell elements in a relatively narrow stacked configuration. In the illustrated embodiment, each memory cell 30 is formed as a memory cell pillar disposed at an intersection between a lower conductive line 22 and an upper conductive line 20. Each memory cell 30 comprises a first active element 38 disposed over the lower conductive line 22 and a second active element 34 disposed over the first active element 38. One of the first and second active elements 38 and 34 comprises a storage material and the other of the first and second active materials comprises a selector material. In embodiments where the memory cell 30 is a phase change memory cell, at least one of the first and the second active elements 38 and 34 can include a chalcogenide material that is configured to switch between crystalline and amorphous phases via an electrical pulse applied between one of the lower conductive lines 22 and one of the upper conductive lines 20 during an access operation, such as a write access operation.

The memory cell 30 can additionally include one or more of a lower electrode 40 interposed between the lower conductive line 22 and the first active element 38, a middle electrode 36 interposed between the first active element 38 and the second active element 34, and an upper electrode 32 interposed between the upper conductive line 20 and the second active element 34. In the illustrated embodiment in FIG. 2A, the lower electrode 40 forms a line which co-extends with the lower conductive line 22. However, in some other embodiments, the lower electrode 40 can also be separated along the x-direction as a discrete pillar component, in a similar manner to the middle electrode 36 and the upper electrode 32. In addition, while in the illustrated embodiment, the upper electrode 32 is separated along the y-direction as illustrated in FIG. 2B, in some other embodiments, the upper electrode 32 can co-extend with the upper conductive line 20. When included, one or more of the electrodes 40, 36 and 32 can include a material, such as carbon, that can serve simultaneously as an electrode material that can provide relatively low contact resistance between adjacent materials, as well as a diffusion barrier against intermixing, e.g., between metal lines and chalcogenide elements, or between chalcogenide elements of different compositions. Thus, in the illustrated embodiment, a memory cell 30 includes the lower electrode 40, the first active element 38, the middle electrode 36, the second active element 34 and the upper electrode 32. In the illustrated embodiment, the memory cell 30 forms a discrete pillar between crossing conductive lines 20 and 22, with the exception of the continuous lower electrode 40.

Referring to FIG. 2A, adjacent memory cells 30 are separated in the x-direction by a gap 42 that is partially filled with a gap-seal dielectric 54 and includes a buried void 62. The partially filled gap 42 includes a seal region above the buried void 62 that is filled with the gap-seal dielectric 54. The seal region can be formed by the gap-seal dielectric 54 that form on upper portions of opposing sidewalls of the adjacent memory cells 30 that abut each other such that the buried void 62 is enclosed. For illustrative purposes only, in FIG. 2A, the bottom end 63 of the seal region corresponding to the top corner of the buried void is formed at a vertical level near the interface between the upper electrode 32 and the second active element 34, which may be a storage material element of the memory cell. In other embodiments, however, the bottom of the seal region can be formed at any vertical location between the upper surface of the upper conductive line 20 and the upper surface of the lower electrode 40, as will be better understood from embodiments of fabrication processes described below with reference to FIGS. 4A-4J.

In the illustrated embodiment in FIG. 2A, the buried void 62 extends vertically from the bottom end 63 of the seal region to upper surface of the lower conductive line 22, or any layer formed thereover such as the lower electrode 40, or as illustrated to the upper surface of any gap-seal dielectric 54 formed on the lower conductive line 22. The gap-seal dielectric 54 separates below the bottom end 63 of the seal region into gap-seal dielectric layers formed on opposing sidewalls of the adjacent memory cell pillars. The gap-seal dielectric layers extend downwards to at least partially cover remaining portions of opposing sidewalls of the adjacent memory cell pillars below the seal region. In the illustrated embodiment, the thicknesses of the gap-seal dielectric layers decrease continuously away from the bottom end 63 of the seal region.

It will be appreciated that the location, shape and the size of the buried void 62 can be chosen based on several factors, including heat transfer considerations and process integration considerations, which can sometimes have competing needs. On the one hand, during operation, the memory cell 30 can generate heat at any of a number of different materials and/or interfaces as a result of Joule heating. The transference of the generated heat from a targeted or accessed memory cell 30 to a neighboring memory cell 30 can be minimized by controlling the location, shape and size of the buried void 62 between the heat-originating region of the target cell 30, and the heat-receiving region of the neighboring memory cell 30. The inventors have found that having the void 62 can reduce the thermal conductivity between cells by as much as $10x$ to $1000x$. Without being bound to any theory, such a reduction can be understood based on typical thermal conductivity of gases, such as air that can fill the buried 62, which can be as low as 0.02 W/(m K). In comparison, typical thermal conductivities of materials that may otherwise fill the gap between adjacent memory cells, such as silicon oxide and silicon nitride, can be as high as 1.4 W/(m K) and 29 W/(m K), respectively. Thus, from heat transfer considerations, the greater the amount of volume between adjacent memory cells 30 occupied by the buried void 62, the greater the thermal insulation between cells.

On the other hand, during fabrication, exposing the buried void 62 to subsequent processes may be undesirable. For example, a buried void 62 that is not buried at sufficient depth can lead to opening of the buried void 62 during a subsequent process, which can lead to exposure of the cavity of the void to undesirable chemicals and materials, which can be trapped, and/or otherwise cause contamination or cross-contamination of the memory cell pillars. Thus, it will be appreciated that while from the point of view of minimizing heat transfer between adjacent memory cells, having a buried void 62 having a particular combination of the location, the shape and the size of the buried void 62 may be desirable, from a process integration point of view, having a different combination of the location, the shape and the size of the buried void 62 may be desirable. Advantageously, according to various embodiments disclosed herein, the location, shape and the size of the buried void 62 can be controlled to balance these competing needs.

To illustrate one example, referring to the illustrated embodiment of FIG. 2A, from a thermal perspective, the buried void 62 advantageously intervenes between corresponding components of adjacent memory cells 30, such as between adjacent storage elements 34 and/or adjacent selector elements 38. Without being bound to any theory, when the storage element 34 is in a high resistance state, a relatively large amount of heat may be generated within the bulk of the storage element 34 and/or its interfaces with the adjacent upper and middle electrodes 32, 36. Thus, the transference of the generated heat to the neighboring storage element 34 and its surrounding regions may be significantly impeded by the buried void 62 interposed between the target and neighboring storage elements 34. In other embodiments where the heat generated by other regions of the memory cell 30, such as the target selector element 38 or its interfaces, contributes to the disturbance of the neighboring storage element 34, the transference of the generated heat can be similarly impeded by the buried void 62 interposed between the target selector element 38 and the neighboring storage element 34. Generally, under many circumstances, minimizing the transference of the heat generated at a target storage element to the neighboring storage elements and/or its surrounding areas can increase the overall energy efficiency of memory access, e.g., write access.

From a process integration perspective, the bottom 63 of the seal region is advantageously located below the lower surface of the upper conductive lines 20, such that the buried void 62 does not get exposed and remains buried by the seal region in a subsequent process such as, for example a chemical-mechanical polish process (CMP). The CMP process may expose top surfaces of partially filled gaps 42 prior to forming the upper conductive line 20. However, such process would not expose the buried void 62.

FIG. 2B is a depiction of the cross-point memory array 100 of FIG. 2A, viewed in the x-direction. In, FIG. 2B, adjacent memory cells 30 are separated in the y-direction by a gap 44 that is partially filled with a gap-seal dielectric 48 and includes a buried void 66. The partially filled gap 44 includes a seal region above the buried void 66 that is formed by the gap-seal dielectric 48 formed on upper portions of opposing sidewalls of the adjacent memory cells 30 that abut each other to fill the seal region. For illustrative purposes only, in FIG. 2B, the bottom end 67 of the seal region corresponding to the top corner of the buried void 66 is formed at a vertical level near the interface between the upper electrode 32 and the storage material element 34. In other embodiments, however, the bottom of the seal region can be formed at any vertical location between the upper surfaces of the upper electrodes 32 and the upper surfaces of the substrate 18.

Similar to the buried void 62 described above with respect to FIG. 2A, the buried void 66 of FIG. 2B extends vertically from the bottom end 67 of the seal region to the substrate 18, to any layer formed thereover or, as illustrated, to the upper surface of any gap-seal dielectric 48 that may be formed on the substrate 18. The gap-seal dielectric layer 48 separates below the bottom end 67 of the seal region into gap-seal dielectric layers formed on opposing sidewalls which at least partially cover remaining portions of opposing sidewalls of the adjacent memory cells 30. In the illustrated embodiment, the thicknesses of the gap-seal dielectric layers formed on the opposing sidewalls decreases continuously away from the seal region.

For similar reasons as described above with respect to FIG. 2A, the location, shape and the size of the buried void 66 of FIG. 2B can be chosen based on several factors, including heat transfer considerations and process integration considerations. In particular, referring to FIG. 2B, from a thermal perspective, the buried void 66 advantageously at least partially intervenes between corresponding features of adjacent memory cells 30, such as between adjacent storage elements 34 and/or adjacent selector elements 38. In addition, from a process integration perspective, the bottom end 67 of the seal region is advantageously located below the lower surface of the upper conductive lines 20, or in the illustrated embodiment below the upper electrodes 32, such that the buried void 62 remains buried by the seal region prior to formation of the upper conductive lines 20. For example, the gap-seal dielectric 48 may be chemical-mechanically polished prior to formation of the conductive lines 20. However, such process would have kept the buried void 66 buried.

FIG. 2C illustrates a cross-point memory array 110 viewed in the z-direction. In particular, FIG. 2C represents a cross section of the cross-point array 100 of FIGS. 2A and 2B, taken in a plane parallel to the major surfaces of the substrate 18. In FIG. 2C, an array of memory cells 30 is arranged as a plurality of rows of memory cell pillars aligned in the x-direction and a plurality of columns of memory cell pillars aligned in the y-direction. Each pair of x-adjacent pillars from adjacent columns is interposed by a gap 42, which is partially filled with the gap-seal dielectric layer 54. The gap-seal dielectric layer 54, in turn vertically (i.e., in the z-direction) seals the gap 42 to form the buried void 62, as described above with respect to the void cusp at the bottom end 63 of the seal region in FIG. 2A. In some embodiments, the buried void 62 forms a continuous channel which extends in the y direction within the gap 42. It will be appreciated that, depending on the vertical location of the cross-section taken of the cross-point memory array 100 of FIG. 2A, the width of the buried void 62 and the thicknesses of the gap-seal dielectric 62 can vary, as described above with respect to FIG. 2A. In a similar manner, each pair of y-adjacent pillars from adjacent rows is interposed by a gap 44, which is partially filled the gap-seal dielectric layer 48. The gap-seal dielectric layer 48, in turn, vertically seals the gap 44 to form the buried void 66, as described above with respect to the void cusp at the bottom end 67 of the seal region in FIG. 2B. Similar to the buried void 62, the buried void 66 forms a continuous channel which continuously extends in the x direction within the gap 44. It will also be appreciated that depending on the vertical location of the cross-section taken of the cross-point memory array 100 of FIG. 2B, the width of the buried void 66 and the thicknesses of the gap-seal dielectric 66 can vary, as described above with respect to FIG. 2B.

In the illustrated embodiment of FIG. 2C, the buried void 62 extending in the y direction and the buried void 66 extending in the x direction intersect each other such that the buried voids form a continuous network of buried voids. In such configurations, each memory pillar is surrounded by a continuous buried void such that various layers of each of the memory cells 30 is laterally isolated from one another. Thus, direct thermal communication between adjacent pillars is minimized in all directions at the vertical levels where the voids 62, 66 are formed.

Referring back to FIGS. 2A and 2B in view of FIG. 2C, it will be appreciated that, depending on the vertical locations of the bottom ends 63 (FIG. 2A) and/or 67 (FIG. 2B), the buried voids 62 and/or 66 can either partially span or fully span the vertical heights of storage elements 34. In some embodiments, both of the bottom ends 63 and 67 are vertically located above the interfaces between the storage elements 34 and the middle electrodes 36, such that the buried voids 62 and 66 laterally surround portions of the vertical heights the storage elements 34. In other embodiments, both of the bottom ends 63 and 67 are vertically located above the interfaces between the storage elements 34 and the top electrodes 32, such that the buried voids 62 and 66 laterally surround entire vertical heights the storage elements 34. In yet other embodiments, one of the bottom ends 63 and 67 can be vertically located above the interfaces between the storage elements 34 and the middle electrodes 36, while the other is vertically located above the interfaces between the storage elements 34 and the top electrodes 32, such that one of the buried voids 62 and 66 fully spans the vertical heights of the storage elements 34, while the other of the buried voids 62 and 66 partially spans the vertical heights of the storage elements 34.

Various elements of the memory cell 30 are now described in more detail, according to various embodiments. Referring to FIGS. 2A-2C, in various embodiments, the gap-seal dielectric layers 48 and 54 can include a suitable dielectric material adapted to protect various portions of the sidewalls of the memory cell 30 during processing while minimizing thermal communication between adjacent memory cells 30. One or both of the gap-seal dielectric layers 48 and 54 can include oxide or nitride materials, such as silicon oxide (e.g., $SiO_2$), aluminum oxide (e.g., $Al_2O_3$) and silicon nitride (e.g., $Si_3N_4$), among others. In some embodiments, the gap-seal dielectric materials 48 and 54 comprise different materials. In some other embodiments, the gap-seal dielectric materials 48 and 54 comprise the same materials.

The upper and/or lower conductive lines 20 and 22 can comprise a metal. Examples of the metal include elemental metals such as Al, Cu, Ni, Cr, Co, Ru, Rh, Pd, Ag, Pt, Au, Ir, Ta, and W; conductive metal nitrides such as TiN, TaN, WN, and TaCN; conductive metal silicides such as tantalum silicides, tungsten silicides, nickel silicides, cobalt silicides and titanium silicides; and conductive metal oxides such as RuO2.

Examples of the second active element 34, which can be a storage element, include a chalcogenide-based phase change storage element, a resistive random access memory (RRAM) storage element (e.g., NiO, $HfO_2$, $ZrO_2$, $Cu_2O$, $TaO_2$, $Ta_2O_5$, $TiO_2$, $SiO_2$, $Al_2O_3$), a conductive bridge random access memory (CBRAM) storage element (e.g., metal-doped chalcogenide), and/or a spin transfer torque random access memory (STT-RAM) storage element, among other types of storage elements.

Examples of the first active element 38, which can be a selector element, include a two terminal device (e.g., a switch), such as a diode, an ovonic threshold switch (OTS), a tunnel junction, or a mixed ionic electronic conduction switch (MIEC), among other two terminal devices.

In embodiments where the memory cell 30 is a phase change memory cell, one or both of the first and second active elements 38 and 34, which can be selector and storage elements, respectively, can comprise chalcogenide materials. When both storage and selector elements comprise chalcogenide materials, the storage element can comprise a chalcogenide material that can undergo a phase change that is nonvolatile at room temperature. On the other hand, the selector element can comprise a chalcogenide material that does not undergo a similar nonvolatile phase change.

In some embodiments, the storage element includes a chalcogenide material such as an alloy including at least two of the elements within the indium(In)-antimony(Sb)-tellurium(Te) (IST) alloy system, e.g., $In_2Sb_2Te_5$, $In_1Sb_2Te_4$, $In_1Sb_4Te_7$, etc., or an alloy including at least two of the elements within the germanium(Ge)-antimony(Sb)-tellurium(Te) (GS T) alloy system, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc., among other chalcogenide alloy systems.

In some embodiments, the selector element includes a chalcogenide material. A selector device having a chalcogenide material can sometimes be referred to as an Ovonic Threshold Switch (OTS). An OTS may include a chalcogenide composition including any one of the chalcogenide alloy systems described above for the storage element and, in addition, further include an element that can suppress crystallization, such as arsenic (As), nitrogen (N) and carbon (C), to name a few. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

Still referring to FIGS. 2A-2C, the upper, middle and lower electrodes 32, 36 and 40 can comprise materials that electrically connect the operational elements of the memory cell but prevent interactions and/or interdiffusion among adjacent materials. For example, depending upon the adjacent materials, suitable electrode materials can include one or more conductive and semiconductive materials such as, for example, carbon (C); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; and conductive metal oxides including RuO2.

Still referring to FIGS. 2A-2C, in some embodiments, the upper and lower conductive lines 20 and 22 and various elements that form the memory cell pillars, including the first and second active elements 38 and 34, can have lateral dimensions, e.g., widths, in x and y directions, selected to be in the range between about 5 nm and 60 nm, for example about 30 nm, in the range between about 5 nm and 40 nm, for example about 25 nm, or between about 5 nm and 30 nm, for example about 20 nm, depending upon the lithographic node for the integrated circuit design. Smaller dimensions are yet possible, limited only by the lithographic capability employed by the person skilled in the art. The upper and lower conductive lines 20 and 22 can have lengths in the y and x directions, respectively, selected to be much greater than the widths, such as at least 100 times greater or at least 1000 times greater than the widths.

Figures 3A, 3B, 3C:
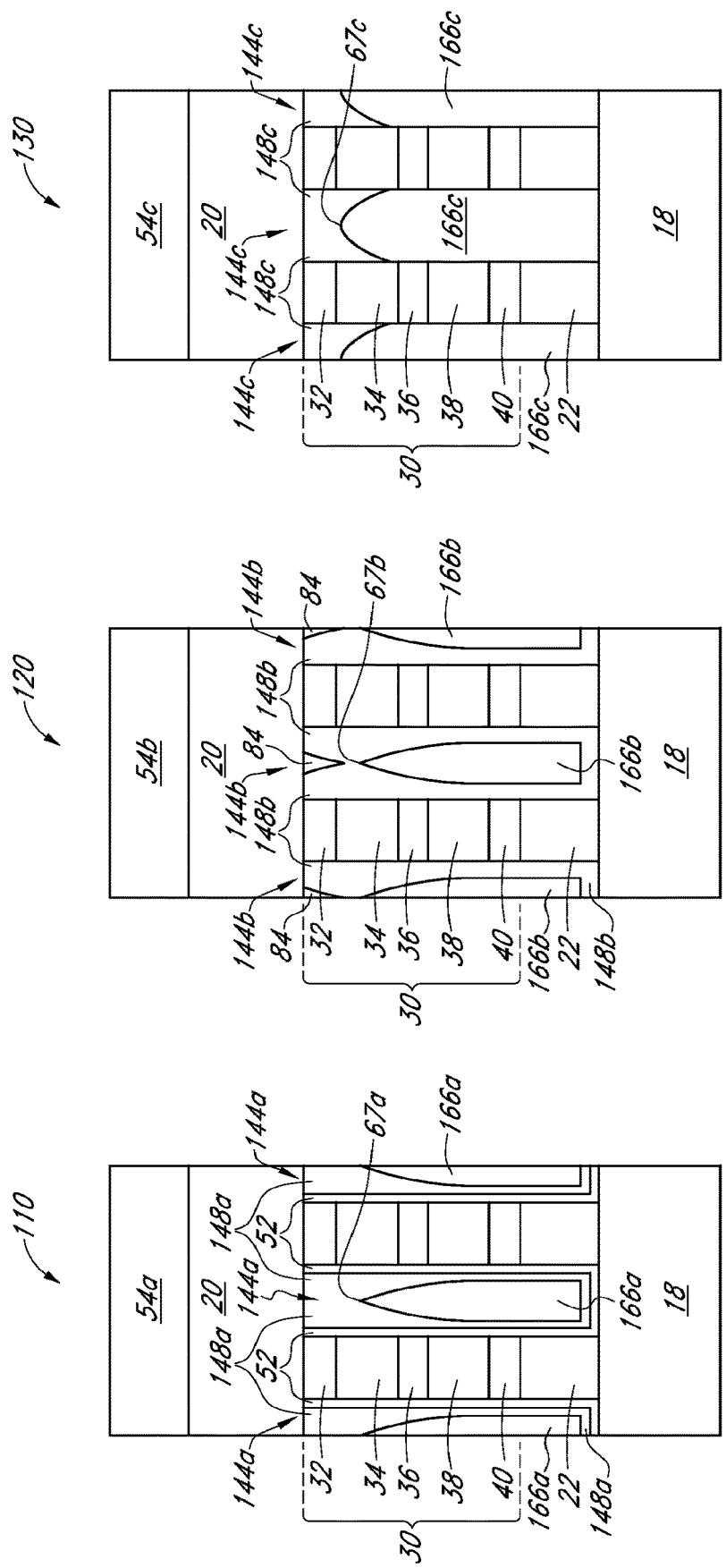
FIGS. 3A-3C are schematic vertical cross sections of memory arrays including phase change materials, taken in a first direction parallel to upper conductive lines, similar to FIG. 2B, according to various embodiments.

Referring to FIGS. 3A-3C, alternative embodiments are illustrated. FIGS. 3A-3C are cross-sectional depictions of cross-point memory arrays 110, 120 and 130, respectively, each having a plurality of memory cells 30 having a pillar structure, viewed in an x-direction, according to various embodiments. Similar to the cross-point memory array 100 described with respect to FIG. 2B, each of the memory arrays 110, 120 and 130 include a memory cell 30 formed as a pillar disposed at an intersection between a lower conductive line 22 and an upper conductive line 20 and comprising a first active element 38 disposed over the lower conductive line 22 and a second active element 34 disposed over the first active element 38, wherein one of the first and second active elements 38 and 34 comprises a storage material and the other of the first and second active elements 38 and 34 comprises a selector material. In FIGS. 3A-3C, for illustrative purposes only, only two memory cells 30 are shown. However, it will be understood that the number of memory cells 30 in a cross-point memory array can include any suitable number of memory cells 30. In addition, while for illustrative purpose, FIGS. 3A-3C show cross-sectional views of cross-point arrays viewed in the x-direction similar to that described with respect to FIG. 2B, it will be understood that the inventive aspects described herein can be implemented as described with cross-sectional views in the y-direction similar to that described with respect to FIG. 2A.

Referring to the cross-point memory array 110 of FIG. 3A, similar to the cross-point memory array 100 described with respect to FIG. 2B, adjacent memory pillars 30 are separated in the y-direction by a gap 144a that is partially filled with a gap-seal dielectric 148a and includes a buried void 166a. Similar to FIG. 2B, the gap-seal dielectric 148a is formed over at least portions of opposing sidewalls of the adjacent memory cell pillars below the seal region, and the thicknesses of the gap-seal dielectric layers 148a on opposite sides of the buried void 166a continuously decreases away from the bottom end 67a of the seal region. Unlike FIG. 2B, however, in FIG. 3A the gap-seal dielectric 148a is not formed directly on bottom surface of the gap and/or opposing side surfaces of the memory cell pillars. Rather, the surfaces of the gap 144a are first lined with a liner dielectric 52 prior to forming the buried void 166a with the gap-seal dielectric 148a. The liner dielectric 52 is formed on bottom surface of the gap 144a and/or opposing side surfaces of the memory cells 30. Under some circumstances, the liner dielectric 52 can, during operation and/or processing, advantageously minimize cross-contamination and/or material inter-diffusion between various elements of the memory cells 30 and surrounding materials, e.g., neighboring memory cells and isolation materials. In some embodiments, the liner dielectric 52 can be formed by a conformal deposition process.

Still referring to FIG. 3A, the gap-seal dielectric 148a is formed on the surfaces of the gap 144a that is lined with the liner dielectric 52, to partially fill the gap 144a, thereby forming the buried void 166a. Similar to FIG. 2B, the partially filled gap 144a includes a seal region above the buried void 166a which extends vertically from the bottom end 67a of the seal region to at least partially cover remaining portions of opposing sidewalls of the adjacent memory cell pillars. Also similar to FIG. 2B, the thickness of the gap-seal dielectric 148a decreases continuously away from the seal region. The gap seal dielectric 148a can be formed by a non-conformal deposition process.

Still referring to FIG. 3A, according to some embodiments, the liner dielectric 52 includes a material that is different from the gap-seal dielectric 148a and can include oxide or nitride materials, such as silicon oxide (e.g., $SiO_2$), aluminum oxide (e.g., $Al_2O_3$) and silicon nitride (e.g., $Si_3N_4$), among others.

Referring to the cross-point memory array 120 of FIG. 3B, similar to the cross-point memory array 100 described with respect to FIG. 2B, adjacent memory cells 30 are separated in the y-direction by a gap 144b that is partially filled with a gap-seal dielectric 148b and includes a first buried void 166b. FIG. 3B is similar to FIG. 2B, except in FIG. 3B, the seal region of the gap-seal dielectric 148*b* does not extend to the bottom surface of the upper conductive line 20. That is, the region of the gap 144*b* above the buried void is not entirely filled with the gap-seal dielectric 148*b*. Instead, the gap 144*b* further includes an isolation region 84 above bottom end 67*b* of the gap-seal region. In some embodiments, the isolation region 84 is filled with a gap-fill dielectric material that is different from the gap-seal dielectric. In other embodiments, the isolation region 84 remains unfilled. While depicted as a significant volume in FIG. 3B, the isolation region 84 can sometimes be a small seam region formed by abutting gap-seal dielectrics from opposing sidewalls.

In some embodiments, the gapfill dielectric material that fills the isolation region 84 includes a material that is similar to the gap-seal dielectric 148*b*, which can include an oxide or nitride materials, such as silicon oxide (e.g., $SiO_2$), aluminum oxide (e.g., $Al_2O_3$) and silicon nitride (e.g., $Si_3N_4$), among others. In some other embodiments, however, the gap-fill dielectric material can include a material that is different from the gap-seal dielectric 148*b*. For example, the gap-fill dielectric may be a spin-on dielectric or an HDP-CVD dielectric that also fills gaps between arrays on the integrated circuit.

Referring to the cross-point memory array 130 of FIG. 3C, similar to the cross-point memory array 100 described with respect to FIG. 2B, adjacent memory cells 30 are separated in the y-direction by a gap 144*c* that is partially filled with a gap-seal dielectric 148*c* and includes a buried void 166*c*. FIG. 3C is similar to FIG. 2B, except in FIG. 3C, the gap-seal dielectric 148*c* extends to only partially cover portions of opposing sidewalls of adjacent pillars while leaving other portions uncovered below the seal region. In the illustrated embodiment, while the gap-seal dielectric 148*c* partially covers opposing sidewalls of the storage elements 34, the remaining portions of the opposing sidewalls of the storage elements 34 and of the opposing sidewalls of the middle electrode 36, selector element 38, the lower electrode 40, and the lower conductive lines 22 remain uncovered by the gap-seal dielectric 148*c*. While not shown, the gap-seal dielectric may also cover portions of the lower conductive line 22 or lower electrode 40 and substrate 18 exposed between pillars during the deposition.

It will be appreciated that in the various embodiments described above with respect to FIGS. 2A-2C and FIGS. 3A-3C, the buried voids 62 and 66 or 166*a*-166*c* can have widths at various vertical levels that are particularly chosen to minimize the thermal communication between corresponding elements of adjacent memory cell pillars. For example, as one example metric, a fraction of the distance between corresponding elements, e.g., storage elements, of adjacent memory cell pillars, can be chosen to be occupied by the buried void. In some embodiments, a distance between adjacent storage elements 34 occupied by the buried void, as measured between the opposing sidewalls in x or y distances, at a mid-thickness level of the storage elements 34, can be between about 20% to about 100% or between about 40% and about 80%, for example about 60%. Here, a distance of 100% occupied by the buried void represents no coverage of the sidewalls by a dielectric, while 0% occupied by the buried void represents gaps that are fully filled, as in the seal region of the partially filled gaps.

In the following, methods of fabricating cross-point memory arrays similar to the cross-point memory array 100 of FIGS. 2A-2C according to various embodiments are described, wherein adjacent memory cell pillars are separated by a partially filled gap that includes a buried void.

FIGS. 4A-4J illustrate cross-sectional views of a cross-point memory array at various stages in a sequence of fabrication, according to some embodiments.

As used herein and throughout the specification, "subtractive patterning" refers to a process sequence where structures to be defined are patterned by the removal of material. For example, a "subtractive patterning process" may include blanket provision of a material to be patterned, followed by lithographically providing etch mask structures overlapping areas to be patterned, followed by etching through the mask, such that materials in areas covered by the mask structures are protected while materials in exposed areas are removed by the etch process. In contrast to subtractive patterning, damascene patterning involves patterning openings (e.g., trenches or vias) in a first structure, blanket depositing material into the openings and over the remaining parts of the first structure, and polishing away the overburden from over the first structure to leave the material of interest patterned in the filled openings.

In the following, it will be understood that while only short segments of certain elongated structures, such as segments of upper conductive lines and lower conductive lines, may be illustrated, in practice such elongated structures may be much longer, e.g., length:width ratios greater than 100:1. In addition, while only a few parallel conductive lines and memory cells may be illustrated, in practice many parallel lines and memory cells may be formed to span a memory array.

In the following, FIGS. 4A, 4C, 4E, 4G and 4I represent cross-sectional views of intermediate array structures of a cross-point memory array at various stages of fabrication, viewed in a y-direction (e.g., along a digit line direction), and FIGS. 4B, 4D, 4F, 4H and 4J represent cross-sectional views of the intermediate array structures corresponding to the intermediate structures of FIGS. 4A, 4C, 4E, 4G and 4I, respectively, viewed in an x-direction (e.g., along a word line direction).

Figure 4B:
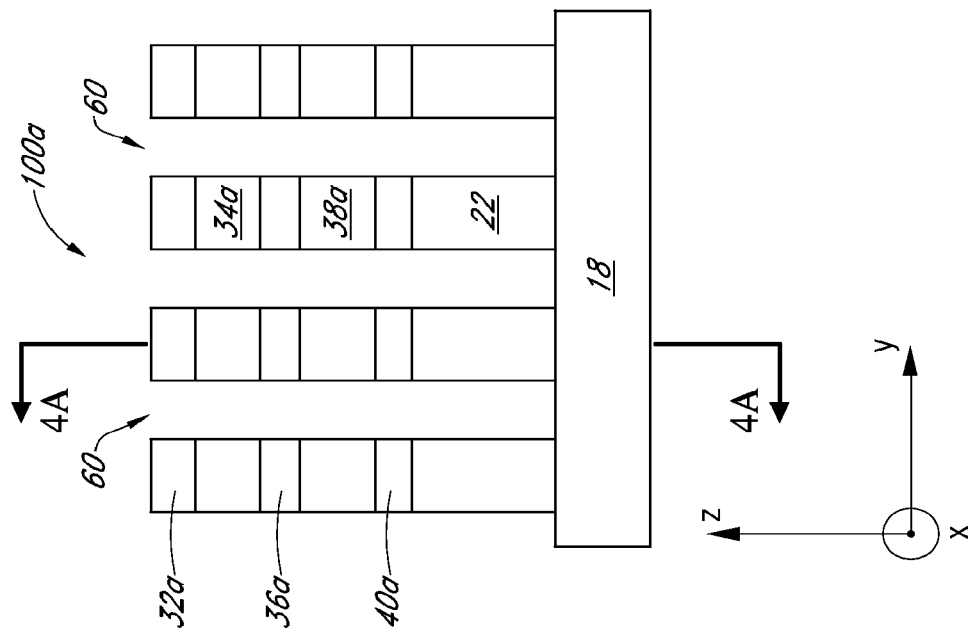
FIGS. 4B, 4D, 4F, 4H and 4J are schematic vertical cross sections of the intermediate structures corresponding to FIGS. 4A, 4C, 4E, 4G and 4I, respectively, taken in a second direction perpendicular to the first direction and parallel to an upper conductive line, according to some embodiments.
Figure 4A:
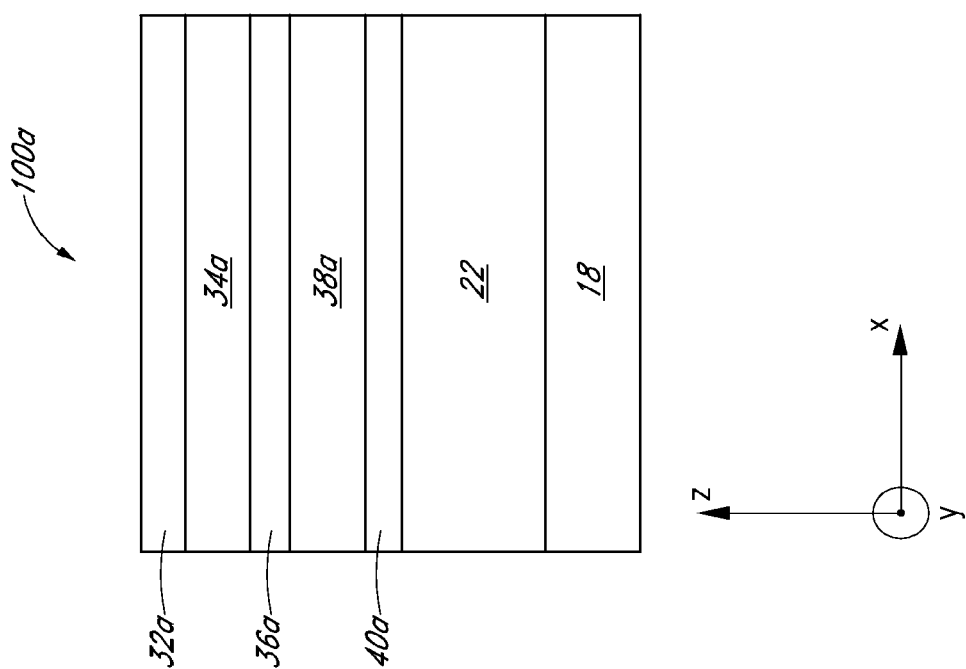
FIGS. 4A, 4C, 4E, 4G and 4I are schematic vertical cross sections of intermediate structures a memory array including phase change materials at various stages of fabrication, taken in a first direction parallel to a lower conductive line, according to some embodiments.

Referring to intermediate array structure 100*a* of FIGS. 4A and 4B, the method of fabricating a memory array includes forming a memory cell material stack on a substrate 18 and subtractively patterning the memory cell material stack and the lower conductive material 22*a* using a first lithographic mask to form a plurality of memory cell line stacks on a lower conductive line 22, both extending in the x-direction. Each of the memory cell line stack and the lower conductive line 22 are patterned from an initial stack having respective blanket materials using the first lithographic mask. In the illustrated embodiment, the memory cell line stack includes a lower electrode line 40*a* on the lower conductive line 22, a first active element line 38*a* (e.g., a selector element line) on the lower electrode line 40*a*, a middle electrode line 36*a* on the first active element line 38*a*, a second active element line 34*a* (e.g., a storage element line) on the middle electrode line 36*a*, and an upper electrode line 32*a* on the second active element line 34*a*. Prior to being patterned, the stack of respective blanket materials may be formed, for example, by deposition techniques such as physical vapor deposition (PVD), chemical vapor deposition (CVD), and atomic layer deposition (ALD), among other deposition techniques. After subtractive patterning, each memory cell line stack extends in the x-direction, and each adjacent cell material stacks are separated by a first gap 60 extending in the x-direction such that the intermediate array structure 100*a* of FIGS. 4A and 4B includes alternating memory cell lines and first gaps 60.

In embodiments where a separate liner dielectric is included, as described above with respect to FIG. 3A, the liner dielectric can be deposited after subtractive patterning.

It will be appreciated that one or more features of the memory cell line stacks of the intermediate structure 100a can be omitted and still have functional memory cells upon completion of fabrication. For example, one of the first or second active element lines 38a or 34a can be omitted in some embodiments, where the omitted active material is a selector material. In addition, one or more of the lower electrode lines 40a, the middle electrode lines 36a and the upper electrode lines 32a can be omitted in some embodiments.

Figure 4D:
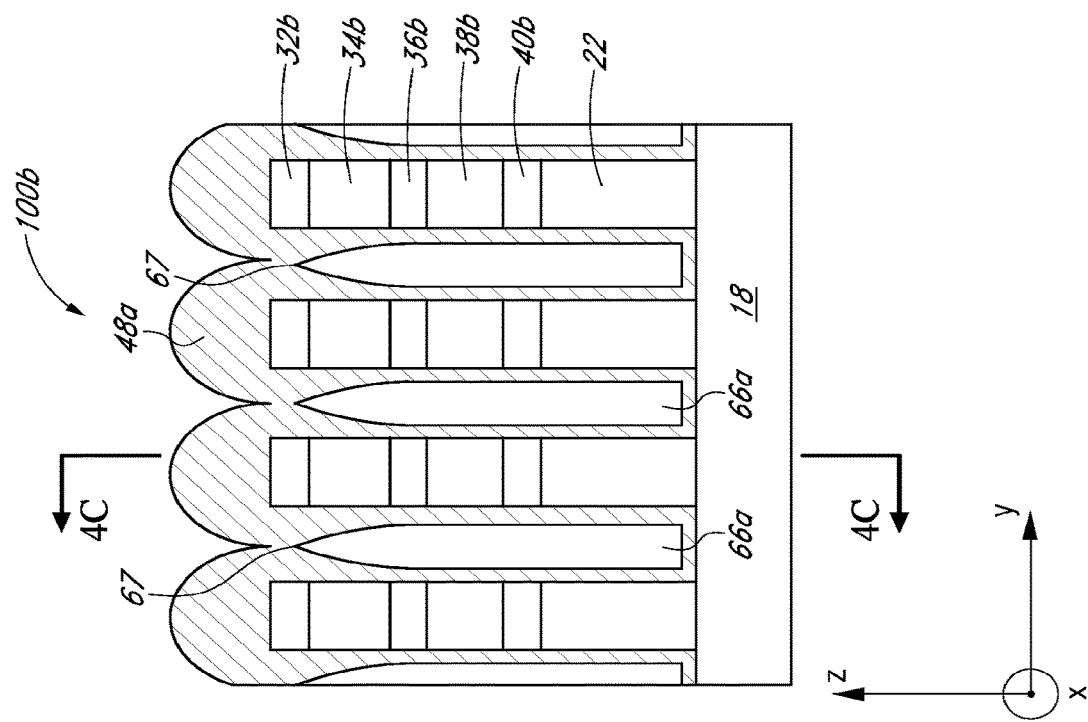
Figure 4C:
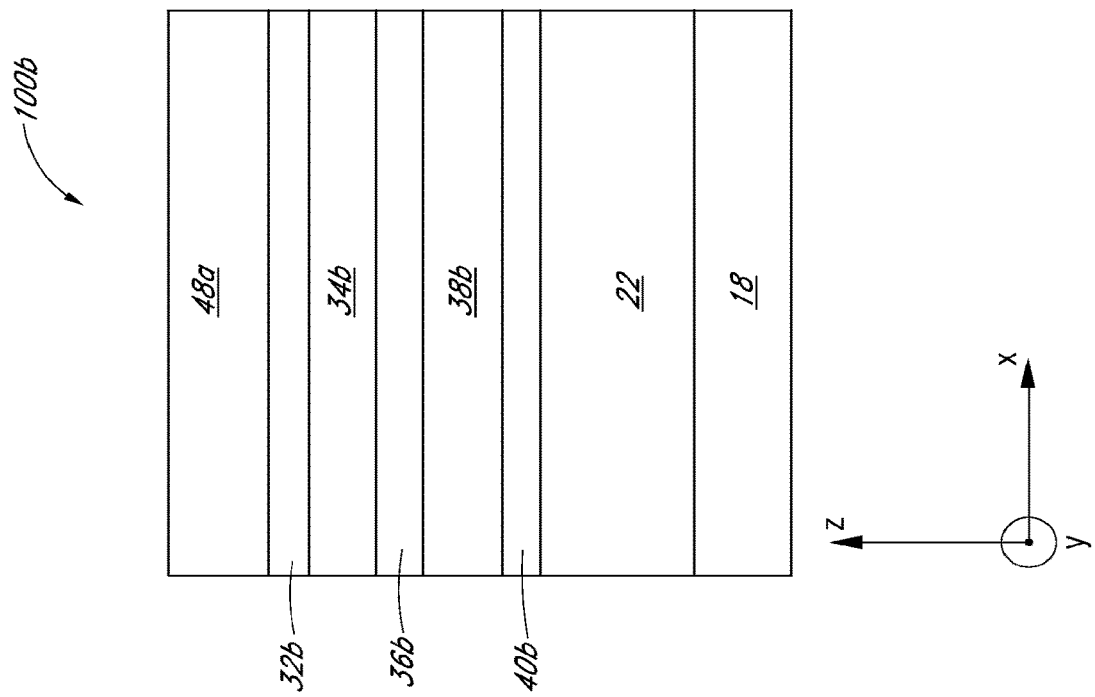

Referring to intermediate array structure 100b of FIGS. 4C and 4D, the method of fabricating a memory array additionally includes, after forming the plurality of alternating memory cell line stacks and first gaps 60 as described above with respect to FIGS. 4A and 4B, only partially filling the first gaps 60 with a gap-seal dielectric 48a to form first buried voids 66a. Each of the partially filled first gaps 60 includes a seal region above the first buried void 66a that is filled with the gap-seal dielectric 48a. A bottom end 67 of the seal region forms a cusp above the void 66a. In the illustrated embodiment, partially filling the first gap 60 includes covering at least portions of opposing sidewalls of the adjacent memory cell pillars below the seal region with the gap-seal dielectric 48a, where the thickness of the gap-seal dielectric continuously decreases away from the seal region.

It will be appreciated that partially filling the first gaps 60 (FIG. 4B) and forming the buried voids 66a can be performed using a suitable dielectric deposition process. A suitable deposition process can be a non-conformal deposition technique in which deposition on sidewalls of pillars within a gap can be controlled such that the resulting void has a desirable shape and location, as described above. Generally, a buried void is formed in a gap when the gap-seal dielectric is deposited on the sidewalls of adjacent pillars at a relatively high rate compared to the bottom-filling rate, such that the gap opening pinches off before the gap below the pinch point can be filled with the gap-seal dielectric. Thus, a suitable technique for forming a buried void may be one in which reactants arrive at the deposition surface in a relatively non-directional manner, such that deposition on sidewalls of the gap, particularly near the corner of the upper end of the memory cell line stack, occurs at relatively high rate in comparison to bottom-filling rate of the gap, such that complete filling of the gap is prevented. Suitable deposition techniques can include, among other techniques, physical vapor deposition (PVD), low pressure chemical vapor deposition (LPCVD), sub-atmospheric chemical vapor deposition (SACVD), plasma-enhanced chemical vapor deposition (PECVD) and atomic layer deposition (ALD). The skilled artisan will appreciate that parameters such as precursor flow rates, pressure, temperature, etc., can be tuned for the desired level of non-conformality.

In will be further appreciated that partially filling the first gaps 60 can be performed using a suitable material or a combination of suitable materials. For example, the inventors have found that under some circumstances (e.g., FIG. 3C), silicon nitride can be deposited as an effective gap-seal dielectric for forming a buried void with a maximum amount of space occupied by the buried void and/or minimizing the amount of deposition on pillar sidewalls below the seal region, thereby minimizing the thermal communication between adjacent memory pillars, as described above. However, under other circumstances, it may be desirable to increase the deposition area and/or thickness of deposition on pillar sidewalls below the seal region. For example, it can be beneficial to have such coverage to suppress interdiffusion of some elements between various layers of a memory pillar. The inventors have found that silicon nitride is also effective in suppressing interdiffusion of various constituents of the memory cell between storage elements and selector elements described above. In addition, silicon nitride can prevent unintended oxidation of various elements of the memory cell. In this regard, it may be desirable use relatively nonconformal silicon nitride as a single material to serve effectively as both a gap-seal dielectric as well as a diffusion barrier material in a configuration similar to FIGS. 2A-2C. However, in some arrangements, it may be beneficial to use a thin conformal silicon nitride for forming a thin (2 nm-5 nm) liner dielectric to line the pillar sidewalls as a diffusion barrier material, and subsequently deposit non conformal silicon oxide as a gap-seal dielectric, in a configuration similar to FIG. 3A. In yet other circumstances, it may be desirable to use silicon nitride or silicon oxide to serve as a gap seal dielectric and use another silicon oxide, which may have a higher throughput or a higher gap-filling capability, as a gap-filling dielectric in a configuration similar to FIG. 3B.

Figure 4F:
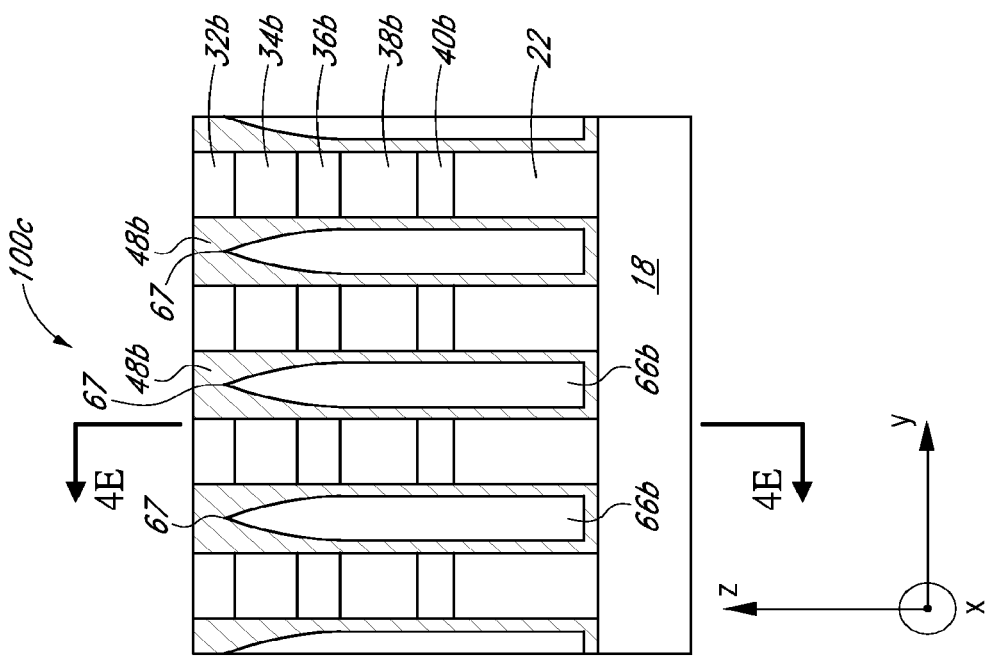
Figure 4E:
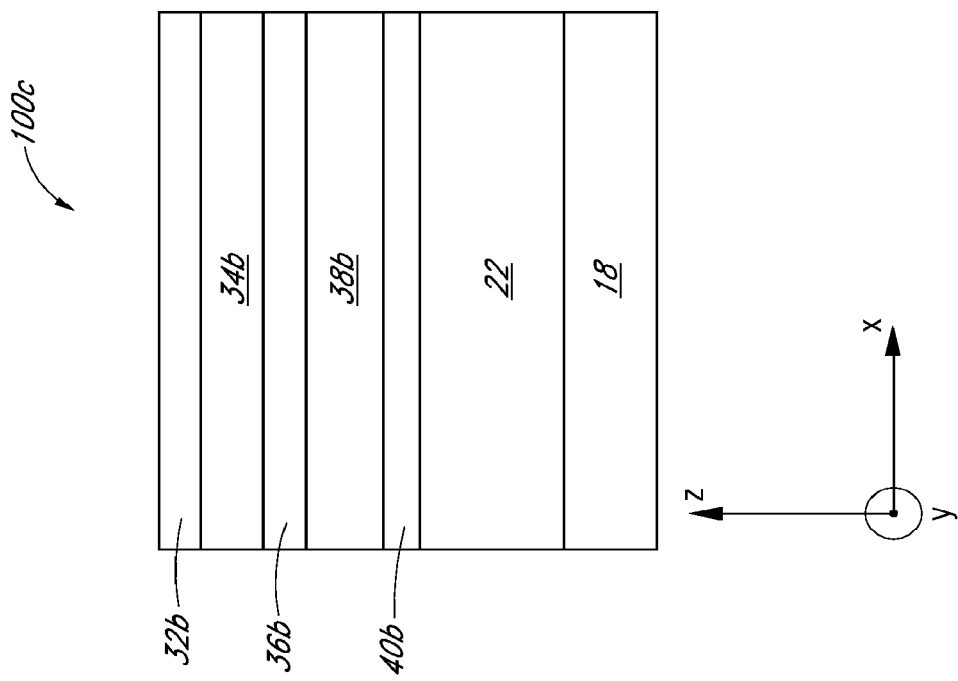

Referring to intermediate array structure 100c of FIGS. 4E and 4F, the method of fabricating the memory array additionally includes planarizing the surface of the intermediate array structure 100b of FIGS. 4C and 4D, which can include an undulating surface of the gap-seal dielectric 48a, which partially fills the first gaps 60 between adjacent memory cell lines, and may also include an overlying gap-filling dielectric that fills gaps between arrays. Planarization can be achieved using, for example, a chemical-mechanical polishing (CMP) process to polish the gap seal dielectric 48a and stopping on the upper electrode lines 32b, thereby exposing a substantially planar surface comprising alternating surfaces of the upper electrode lines 32b interposed by planarized gap-seal dielectric layers 48b. It will be appreciated that in preferred embodiments, the buried voids 66b form a buried channel extending in the x-direction and remain buried through the length of the memory cell material line. Keeping the voids 66b buried can be advantageous, for example, in preventing the void cavity from trapping contaminants. Thus, in the illustrated embodiment, the CMP process forms a planarized surface having exposed surfaces of upper electrode lines 32b and gap-seal dielectric layers 48b that alternate in the y-direction.

It will be appreciated that in embodiments where a separate liner dielectric is formed as described with respect to FIG. 3A, the exposed surface after CMP includes upper ends of the liner dielectrics. In addition, in embodiments where a separate isolation region filled with a gap-fill dielectric is formed as described with respect to FIG. 3B, the exposed surface after CMP includes the gapfill dielectric.

Figure 4H:
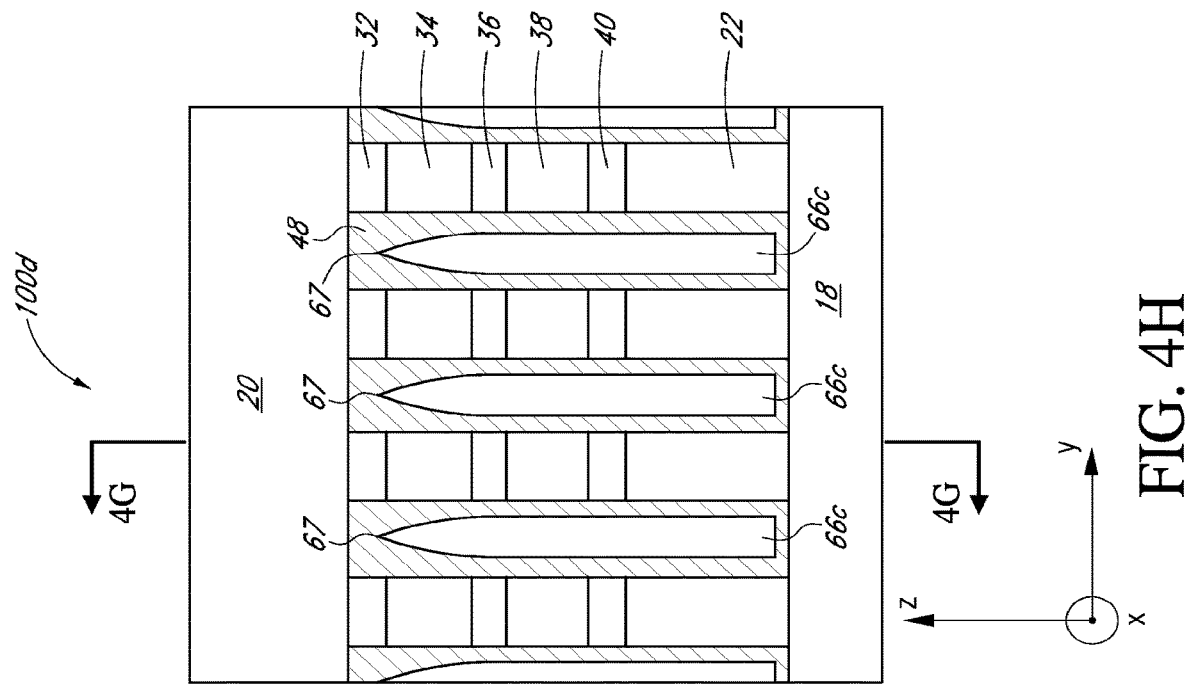
Figure 4G:
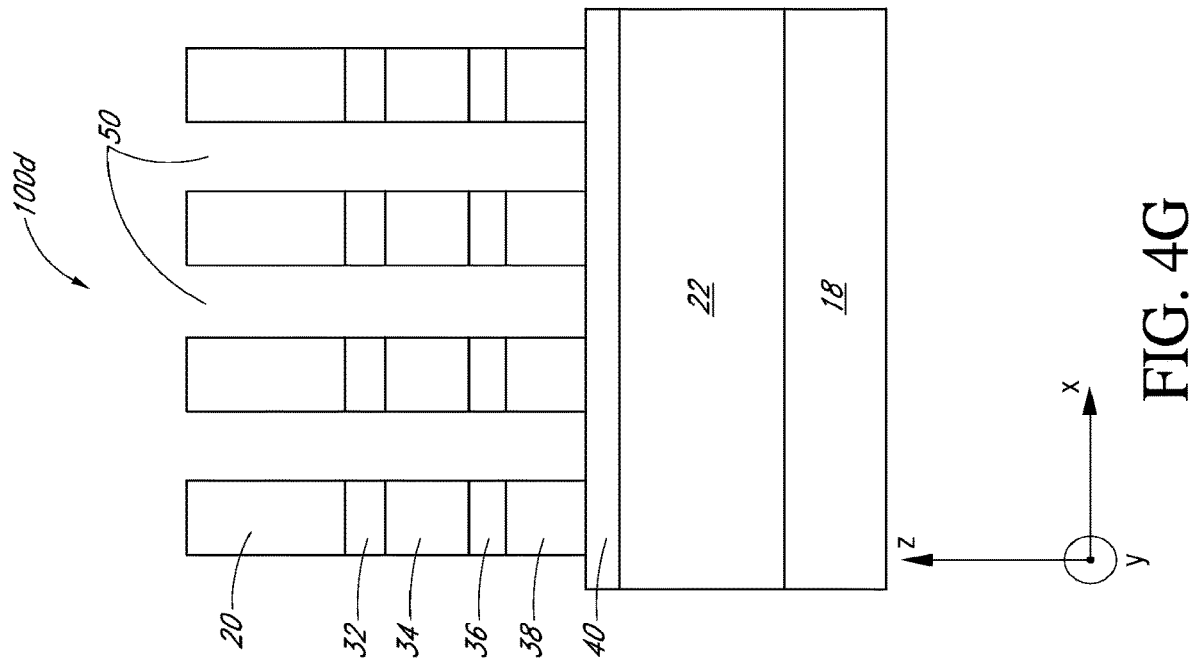

Referring to intermediate array structure 100d of FIGS. 4G and 4H, the method of fabricating the memory array additionally includes depositing an upper conductive material on the substantially planar surface and subtractively patterning using a second lithographic mask to form a plurality of upper conductive lines 20 extending in the y-direction. Formation of the upper conductive lines 20 is followed by formation of memory cell pillars, which can be performed, in some embodiments, by using the upper conductive lines 20 as a hard mask to remove, e.g., by etching, materials of the memory cell line stacks from exposed regions between upper conductive lines 20. In the illustrated embodiment, etching is stopped at the lower electrode line 40 such that each resulting memory cell pillar includes the upper electrode 32, the storage element 34, the middle electrode 36 and the selector element 38, while the lower electrode line 40 remains co-extensive with the lower conductive line 22. However, it will be appreciated that etching can be stopped at other layers, for example at selector material 38, such that the selector material also remains co-extensive with the lower conductive line 22 and the lower electrode line 40. The resulting intermediate array structure has memory cell pillars formed at each intersection of upper conductive lines 20 and lower conductive lines 22, wherein each pair of adjacent memory cell pillars in the y-direction is separated by a partially filled gap which pillars that includes a buried void 66c, and wherein each pair of adjacent memory cell pillars in the x-direction is separated by a second gap 50.

Figure 4J:
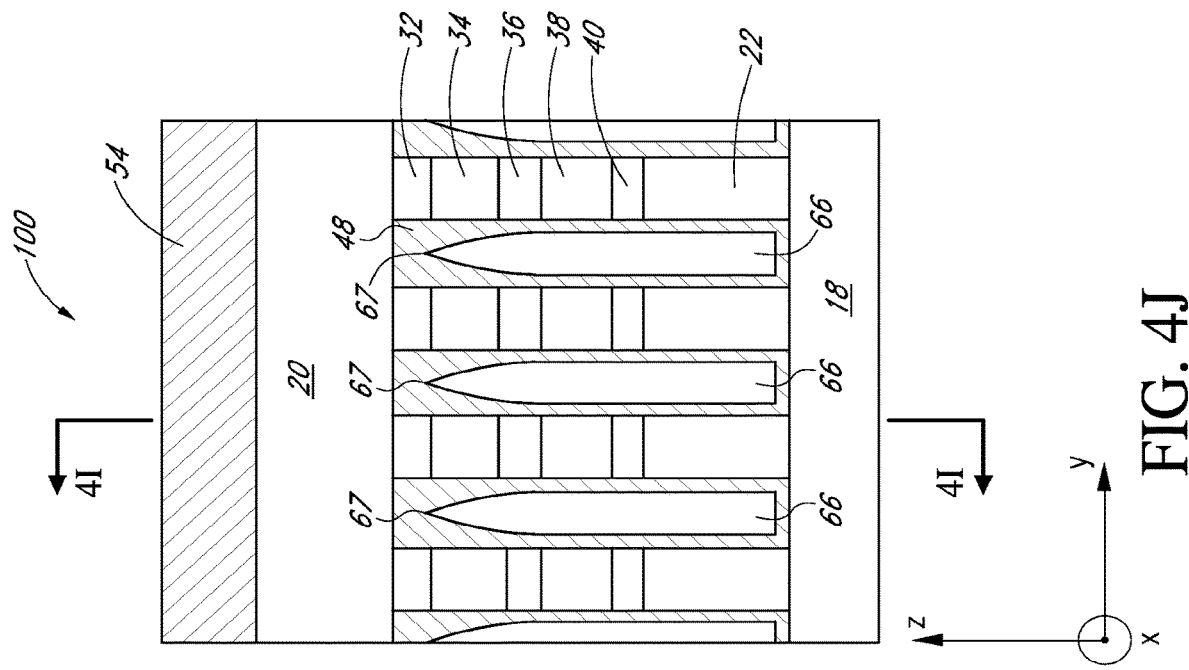
Figure 4I:
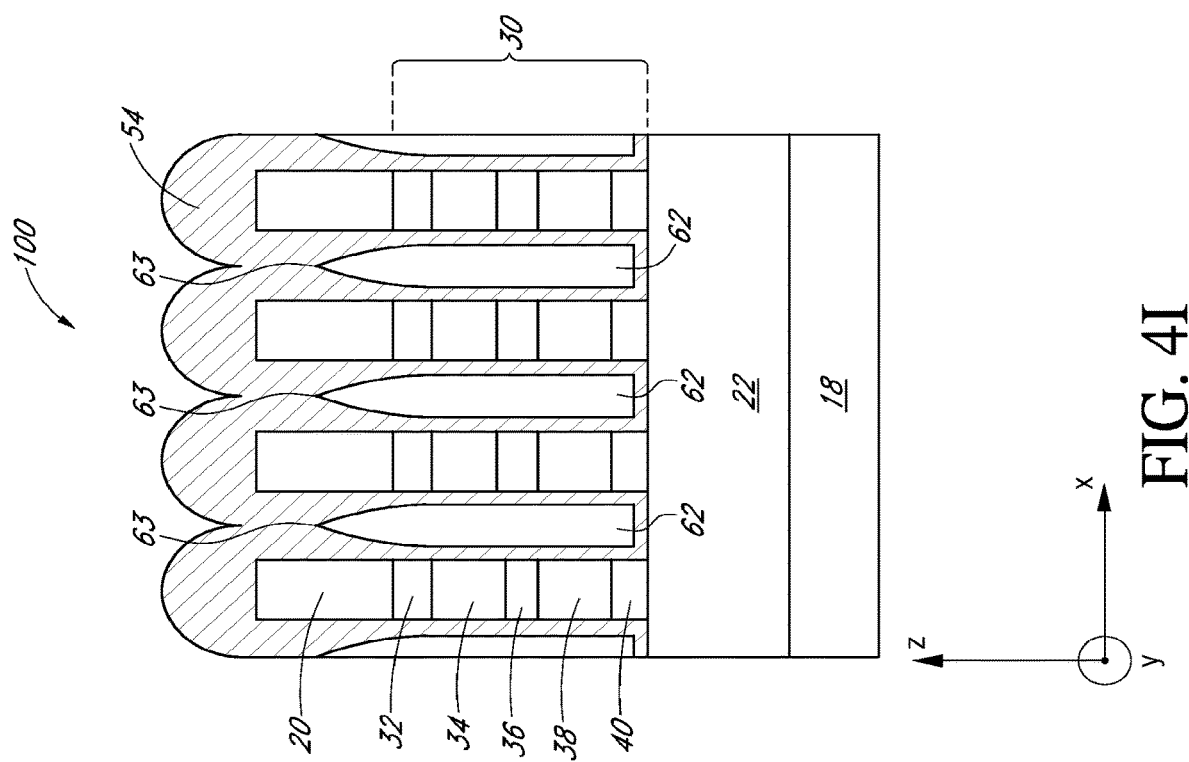

Referring to intermediate array structure 100 of FIGS. 4I and 4J, the method of forming the memory array additionally includes, after forming the plurality of memory cell pillars, partially filling the second gaps 50 (FIG. 4G) with a gap-seal dielectric 54 to form second buried voids 62. Similar to partially filling the first gaps 60 described above with respect to FIGS. 4C and 4D, partially filling the second gaps 50 includes forming a seal region above the buried void 62 that is filled with the gap-seal dielectric 54, as well as covering at least portions of opposing sidewalls of the adjacent memory cell pillars below the seal region with the gap-seal dielectric 54. The materials and deposition processes used for partially filling the second gaps 50 can be substantially similar to those described above with respect to FIGS. 4C and 4D. Subsequently, the method of fabricating the memory array additionally may include planarizing (not shown) the surface of the intermediate array structure 100 of FIGS. 4I and 4J using, for example, a chemical-mechanical polishing (CMP) process and stopping on the upper conductive lines 20, thus exposing a substantially planar surface comprising alternating surfaces of the upper conductive lines 20 interposed by seal-regions filled with the gap-seal dielectric 54.

It will be appreciated that, in contrast to partially filling the first gaps 60 described above with respect to FIGS. 4C and 4D, in FIGS. 4I and 4J, partially filling the second gaps 50 can form the second buried voids 62 that can extend above the upper surface of upper electrode 32. In other words, the lower end 63 of the seal region in FIG. 4I can extend to a vertical position anywhere below the top surface of the upper conductive line 20. This is because, as described above, in the subsequent CMP process (not shown), the gap-seal dielectric 54 may be planarized with respect to the upper surface of the upper conductive lines 20, and having the buried void extend above the upper surface of the upper electrode 32 would not expose the cavities of the buried void 62 to subsequent processes.

It will be appreciated that while the buried voids 62 (FIG. 4I) and 66 (FIG. 4J) may extend through substantial or entire lengths of the memory array in the y-direction (which may be equal to the length of the upper conductive lines 20) and in the x-direction (which may be equal to the length of lower conductive lines 22), respectively, the buried voids 62 and 66 may remain capped at the lateral ends of the memory array. The ends may be capped, for example, by depositing the gap-seal dielectrics 48 and 54 that are sufficiently thick such that the ends of the buried voids 62 and 66 become pinched off in the y-direction and in the x-direction, respectively. The ends may also be capped by depositing sufficient gap-seal dielectrics 48 and 54 such that regions of the voids 62, 66 adjacent the ends of the array in the x-direction ad in the y-direction, respectively, bottom-fill up to vertical levels at or exceeding the ends 67 and 63, respectively. In yet other examples, the sufficient amount of gap-seal dielectrics can be deposited in more than one deposition steps. Other dielectric layer depositions may also seal the lateral ends of the voids 62, 66. As a result, the cavities of the buried voids 62 and 66 remain unexposed to processes subsequent to formation of the buried voids 62 and 66.

Still referring to FIGS. 4I and 4J, it will be further appreciated that a liner dielectric can be formed prior to partially filling the second gaps 50, in a similar manner as described above with respect to FIG. 3A and FIGS. 4C/4D. In addition, an additional isolation region can be formed in a similar manner as described above with respect to FIG. 3B and FIGS. 4C/4D. Furthermore, at least some portions of the sidewalls of the pillars can remain uncovered by the gap-seal dielectric 54, as described above with respect to FIG. 3C and FIGS. 4C/4D.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A memory device, comprising:
 a first memory cell pillar disposed between a lower conductive line and an upper conductive line, the first memory cell pillar comprising a first active element;
 a second memory cell pillar separated from the first memory cell pillar in a first direction by a gap; and
 a seal region disposed in the gap between the first and second memory cell pillars, the seal region comprising a gap-seal dielectric, wherein the seal region is formed above a buried void, wherein a bottom surface of the seal region forms a top surface of the buried void that terminates before extending to contact a bottom surface of the upper conductive line, wherein the buried void is in contact with at least a portion of the first active element, at least a portion of a middle electrode in contact with the first active element, at least a portion of a second active element in contact with the middle electrode, and at least a portion of opposing side walls of each of the first memory cell pillar and the second memory cell pillar, wherein a first portion of the second active element disposed below the bottom surface of the seal region contacts the gap-seal dielectric disposed in the gap and a second portion of the second active element disposed below the bottom surface of the seal region is separated from the first memory cell pillar or the second memory cell pillar by the buried void.

2. The memory device of claim 1, wherein the seal region extends from above the buried void to contact the bottom surface of the upper conductive line.

3. The memory device of claim 1, wherein the first memory cell pillar comprises the second active element, and wherein the bottom surface of the seal region is formed at a vertical location between an upper electrode and the second active element.

4. The memory device of claim 1, wherein the bottom surface of the seal region is formed at a vertical location disposed between an upper surface of the upper conductive line and an upper surface of a lower electrode.

5. The memory device of claim 1, wherein the buried void extends vertically from the bottom surface of the seal region to an upper surface of the lower conductive line.

6. The memory device of claim 1, wherein the buried void extends vertically from the bottom surface of the seal region.

7. The memory device of claim 1, wherein the gap-seal dielectric is formed over at least a portion of the opposing side walls below the seal region.

8. The memory device of claim 1, wherein the first memory cell pillar comprises the second active element, wherein at least one of the first active element or the second active element is a storage material and the other of the first active element or the second active element is a selector material.

9. A memory device, comprising:
- a first memory cell pillar disposed between a lower conductive line and an upper conductive line, the first memory cell pillar comprising a first active element;
- a second memory cell pillar separated from the first memory cell pillar in a first direction by a gap that is at least partially filled with a gap-seal dielectric that forms a seal region; and
- a buried void formed underneath the seal region and in contact with at least a portion of the first active element, at least a portion of a middle electrode in contact with the first active element, at least a portion of a second active element in contact with the middle electrode, and at least a portion of opposing side walls of each of the first memory cell pillar and the second memory cell pillar, wherein the seal region is at least partially filled with the gap-seal dielectric covering portions of opposing side walls of the first and second memory cell pillars, wherein the portions of the opposing side walls and a first portion of the second active element disposed below a bottom surface of the seal region contact the gap-seal dielectric disposed in the gap and a second portion of the second active element disposed below the bottom surface of the seal region is separated from the first memory cell pillar or the second memory cell pillar by the buried void, wherein the bottom surface of the seal region forms a top surface of the buried void that terminates before extending to contact a bottom surface of the upper conductive line.

10. The memory device of claim 9, further comprising:
- a second gap disposed above the buried void, wherein the second gap is at least partially filled with a material different than the gap-seal dielectric; and
- wherein the second gap comprises an isolation region at least partially filled with the material.

11. The memory device of claim 10, wherein the gap-seal dielectric and the material are different materials.

12. The memory device of claim 9, further comprising:
- a second gap disposed above the buried void, wherein the second gap is at least partially filled with a material different than the gap-seal dielectric; or
- wherein the second gap comprises an isolation region that is unfilled.

* * * * *